(12) United States Patent
Chang (10) Patent No.: US 9,332,295 B2
(45) Date of Patent: May 3, 2016

(54) WIRELESS TRANSMISSION AND VIDEO INTEGRATED APPARATUS

(71) Applicant: Nai-Chien Chang, New Taipei (TW)

(72) Inventor: Nai-Chien Chang, New Taipei (TW)

( * ) Notice: Subject to any disclaimer, the term of this patent is extended or adjusted under 35 U.S.C. 154(b) by 0 days.

(21) Appl. No.: 14/753,640

(22) Filed: Jun. 29, 2015

(65) Prior Publication Data

US 2016/0007068 A1  Jan. 7, 2016

(30) Foreign Application Priority Data

Jul. 2, 2014 (TW) .............................. 103211750 U (51) Int. Cl.

| | |
|---|---|
| H04N 5/225 | (2006.01) |
| H04N 21/4143 | (2011.01) |
| H04N 21/4223 | (2011.01) |
| H04N 21/422 | (2011.01) |
| H04N 21/437 | (2011.01) |
| H04N 21/426 | (2011.01) |
| H01L 23/00 | (2006.01) |
| H05K 1/14 | (2006.01) |
| H05K 3/34 | (2006.01) |

(52) U.S. Cl.
CPC ............ *H04N 21/4143* (2013.01); *H01L 24/00* (2013.01); *H04N 5/2251* (2013.01); *H04N 21/426* (2013.01); *H04N 21/4223* (2013.01); *H04N 21/42203* (2013.01); *H04N 21/437* (2013.01); *H05K 1/141* (2013.01); *H01L 2924/00* (2013.01); *H05K 3/3447* (2013.01); *H05K 2201/041* (2013.01)

(58) Field of Classification Search
CPC .................... H04N 21/4143; H04N 21/42203; H04N 21/4223; H04N 21/426; H04N 21/437; H04N 5/765; H04N 5/2251; H04N 5/38; H04N 5/44; H01L 24/00; H05K 1/141
See application file for complete search history.

(56) References Cited

U.S. PATENT DOCUMENTS

| | | | |
|---|---|---|---|
| 2009/0189981 A1* | 7/2009 | Siann ...................... | H04N 7/183 348/143 |
| 2011/0096168 A1* | 4/2011 | Siann ...................... | H04N 7/183 348/158 |

* cited by examiner

*Primary Examiner* — Nicholas Giles
(74) *Attorney, Agent, or Firm* — Chun-Ming Shih; HDLS IPR Services (57) ABSTRACT

A wireless transmission and video integrated apparatus includes a video module and a wireless module. The video module includes a hub unit, an image processing unit, an image acquisition unit, a microphone unit, an expansion interface and a transmission interface. The wireless module includes a connection interface, a wireless communication unit and an antenna unit. The wireless module is electrically connected to the expansion interface of the video module through the connection interface. The video module and the wireless module are integrated as a whole, and then are electrically connected to an external electronic apparatus through the transmission interface of the video module, so that assembling the wireless transmission and video integrated apparatus into the electronic apparatus is quick.

13 Claims, 9 Drawing Sheets

WIRELESS TRANSMISSION AND VIDEO INTEGRATED APPARATUS

BACKGROUND OF THE INVENTION

1. Field of the Invention

The present invention relates to an integrated apparatus, and especially relates to a wireless transmission and video integrated apparatus.

2. Description of the Related Art

Nowadays, electronic apparatuses, such as notebook computers, tablet computers or smart phones, usually have a lot of function modules to meet users' requirements. For examples, the video function and the surfing internet function are the two most frequently used functions that common users use. Therefore, current electronic apparatuses usually have built-in function modules in accordance with the two functions mentioned above.

To take the notebook computer as an example, a video module providing the video function is usually arranged at the upper border of the monitor of the notebook computer, and the video module is then connected to a main board through a cable. Moreover, an internet processing chip providing the surfing internet function is usually arranged on the main board of the notebook computer, and an antenna is arranged at one of the borders of the monitor, and then the antenna is connected to the internet processing chip on the main board through a cable to obtain better internet quality.

As mentioned above, current electronic apparatuses have the video function and the surfing internet function. However, the video module, the internet processing chip and the antenna mentioned above are manufactured respectively and are assembled to the electronic apparatus respectively, and then are connected to each other through cables. Therefore, manufacturing and assembling the electronic apparatus spends a lot of time in the production line.

In order to solve the above-mentioned problems, a new integrated module integrating the video module, the internet processing chip and the antenna mentioned above are provided to save manufacturing and assembling time.

However, manufacturing and selling a new module which is related to the internet processing function usually needs the certification from the relative organization. Therefore, the manufacturer manufacturing and selling the new module mentioned above costs a lot of certification fee. Moreover, if the internet processing chip mentioned above is a Wi-Fi chip or a Bluetooth chip, the manufacturer manufacturing and selling the new module having Wi-Fi function or Bluetooth function even costs more certification fee because the Wi-Fi protocol and the Bluetooth protocol are complex and have higher certification fee.

SUMMARY OF THE INVENTION

The main object of the present invention is to provide a wireless transmission and video integrated apparatus that integrates the video module and the wireless module by the expansion method to save manufacturing time and process, wherein the video module and the wireless module are manufactured and assembled to the electronic apparatus respectively for the conventional electronic apparatus. In the meantime, the manufacturer does not need to manufacture the new module integrating the functions mentioned above.

In order to achieve the object mentioned above, the wireless transmission and video integrated apparatus of the present invention comprises a video module and a wireless module. The video module comprises a hub unit, an image processing unit, an image acquisition unit, a microphone unit, an expansion interface and a transmission interface. The wireless module comprises a connection interface, a wireless communication unit and an antenna unit. The wireless module is electrically connected to the expansion interface of the video module through the connection interface.

Comparing to the prior art, the advantage of the present invention is that the video module and the wireless module are integrated as a whole through the hub module, and then are electrically connected to the electronic apparatus through the transmission interface, so that assembling the wireless transmission and video integrated apparatus of the present invention into the electronic apparatus is quick and convenient.

Moreover, because the hub module of the present invention is connected to the wireless module by the expansion method, the wireless module already existing and having the certification can be used directly. Therefore, the certification fee for the new module mentioned above is saved.

DETAILED DESCRIPTION OF THE INVENTION

Please refer to following description and figures for the detailed features and technical contents of the present invention. However, the following description and figures are referred for the present invention, but the present invention is not limited to it.

Figure 1:
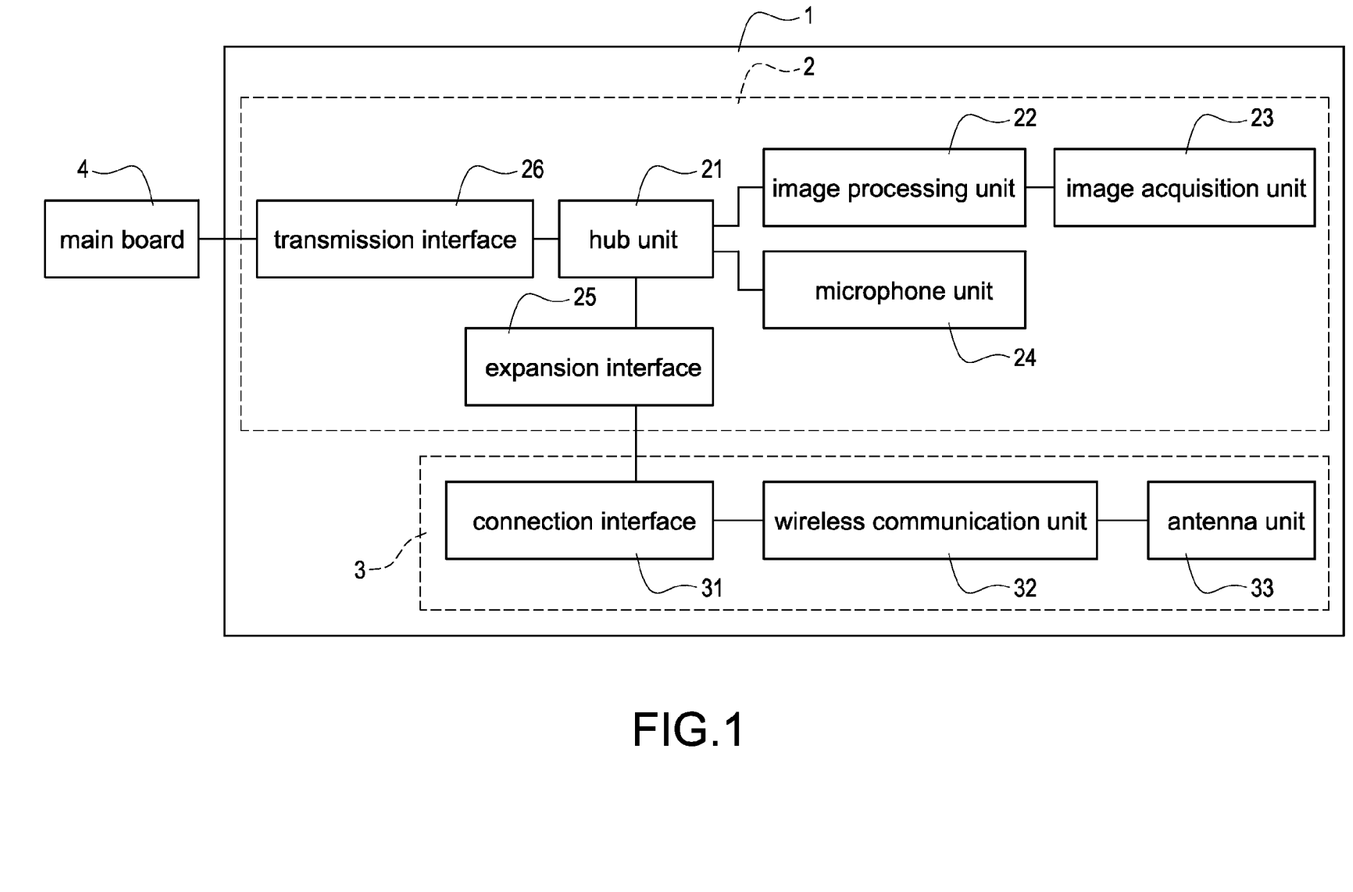
FIG. 1 shows a block diagram of the first embodiment of the present invention.
Figure 2:
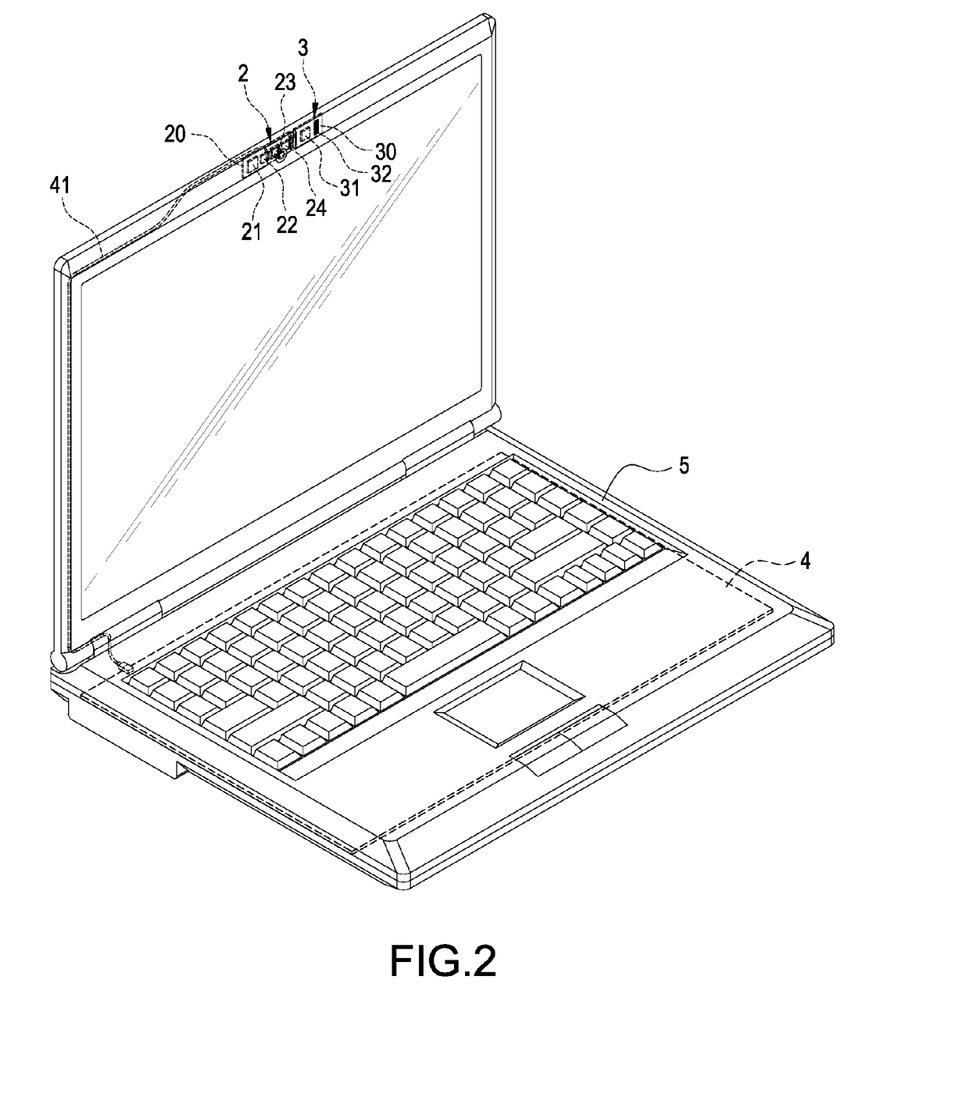
FIG. 2 shows a connection diagram of the first embodiment of the present invention.

FIG. 1 shows a block diagram of the first embodiment of the present invention. FIG. 2 shows a connection diagram of the first embodiment of the present invention. As shown in FIG. 1 and FIG. 2, the present invention provides a wireless transmission and video integrated apparatus 1. The wireless transmission and video integrated apparatus 1 comprises a video module 2 and a wireless module 3.

The video module 2 mainly comprises a first circuit board 20, a hub unit 21, an image processing unit 22, an image acquisition unit 23, a microphone unit 24, an expansion interface 25 and a transmission interface 26. The first circuit board 20 is electrically connected to the hub unit 21, the image processing unit 22, the image acquisition unit 23, the microphone unit 24, the expansion interface 25 and the transmission interface 26. The first circuit board 20 is mainly made of hard glass fibers or soft thin films. The hub unit 21 is, for example but not limited to, a hub integrated circuit (IC).

The hub unit 21 is electrically connected to the image processing unit 22, the microphone unit 24, the expansion interface 25 and the transmission interface 26 through the first circuit board 20, so that the video module 2 and a module (namely, the wireless module 3) connected to the expansion interface 25 are integrated. The hub unit 21 is electrically connected to (or outputs to) a main board 4 of an external electronic apparatus (for example, a computer 5 shown in FIG. 2) through the transmission interface 26. In this embodiment, the hub unit 21 is directly electrically connected to the image processing unit 22 and the microphone unit 24 through the first circuit board 20, and is connected to the wireless module 3 through the expansion interface 25.

Specifically, the transmission interface 26 is electrically connected to a transmission line 41 and is electrically connected to the main board 4 through the transmission line 41. In this embodiment, the transmission interface 26 is a plurality of connection points. One side of the transmission line 41 is welded and connected directly to the connection points. The other side of the transmission line 41 is electrically connected to the main board 4. In other embodiments, the transmission interface 26 is, for examples but not limited to, a connector or a cable socket to be electrically connected to a connector or a cable plug at one side of the transmission line 41.

The image acquisition unit 23 is, for example, a charge-coupled device (CCD) or a complementary metal-oxide semiconductor (CMOS) camera lens for acquiring external image signals.

The image processing unit 22 is electrically connected to the image acquisition unit 23. The image processing unit 22 processes the image signals outputted from the image acquisition unit 23 with an analog-to-digital conversion to obtain a converted image signal and then outputs the converted image signal. Moreover, the converted image signal can be amplified by an amplifying circuit (not shown in FIG. 1 or FIG. 2) before being outputted from the image processing unit 22. According to the requirement, a plurality of the image acquisition units 23 can be arranged, so that the computer 5 shown in FIG. 2 can take 3D pictures or videos through these image acquisition units 23. Moreover, going with the software, these image acquisition units 23 can be combined as a somatosensory input unit.

The image processing unit 22 is electrically connected to the hub unit 21. Therefore, the converted image signal mentioned above is sent from the image processing unit 22 to the hub unit 21 directly for integration.

The microphone unit 24 is directly electrically connected to the hub unit 21. The microphone unit 24 receives external audio signals and outputs the external audio signals to the hub unit 21 for integration.

The wireless module 3 mainly comprises a second circuit board 30, a connection interface 31, a wireless communication unit 32 and an antenna unit 33. The second circuit board 30 is electrically connected to the connection interface 31, the wireless communication unit 32 and the antenna unit 33. The antenna unit 33 is, for examples, an IC antenna or a planar inverted-F antenna (PIFA). Moreover, when the second circuit board 30 is processed with the surface line printing, the patterns of the antenna unit 33 can be printed on the second circuit board 30 to form the antenna unit 33 on the second circuit board 30 directly.

The wireless communication unit 32 is electrically connected to the antenna unit 33. When the antenna unit 33 receives a wireless signal, the antenna unit 33 sends the wireless signal to the wireless communication unit 32. The wireless communication unit 32 processes the wireless signal to obtain a processed signal. The wireless communication unit 32 is electrically connected to the connection interface 31. The wireless module 3 is electrically connected to the expansion interface 25 of the video module 2 through the connection interface 31. Therefore, the wireless communication unit 32 outputs the processed signal to the video module 2 through the connection interface 31.

In this embodiment, the wireless communication unit 32 is, for examples but not limited to, a Wi-Fi communication unit, a Bluetooth communication unit, a near field communication (NFC) communication unit, a radio frequency (RF) communication unit, a Zigbee communication unit, a global positioning system (GPS) communication unit or an infrared communication unit etc. In the present invention, according to the requirement of the manufacturer, the wireless module 3 with different types or designed by different manufacturers can be connected to the expansion interface 25 of the video module 2 by the expansion method to form different types of the wireless transmission and video integrated apparatus 1. It is convenient.

Components related to video functions are directly arranged on the first circuit board 20. The video module 2 is electrically connected to the wireless module 3 through the expansion interface 25. Therefore, the video module 2 and the wireless module 3 are integrated as a whole. The wireless transmission and video integrated apparatus 1 respectively processes the video signal sent from the image processing unit 22, the audio signal sent from the microphone unit 24 and the wireless signal sent from the wireless module 3 through the hub unit 21, and then sends the signals mentioned above to the main board 4 through the transmission interface 26 for farther processes and applications.

As shown in FIG. 2, the wireless transmission and video integrated apparatus 1 of the present invention is deemed as one object and directly arranged in an electronic apparatus, such as arranged at the upper border of the monitor of the electronic apparatus 5 (computer), and then electrically connected to the main board 4 of the electronic apparatus 5 (computer) through the single transmission line 41. Therefore, the assembly time of the wireless transmission and video integrated apparatus 1 can be reduced greatly. Moreover, at the upper border of the monitor of the electronic apparatus 5 (computer), the video function and the audio function provided by the video module 2 are the best (namely, acquiring the best video signal and the best audio signal). The antenna unit 33 can provide the best wireless transmission quality.

Figure 3A:
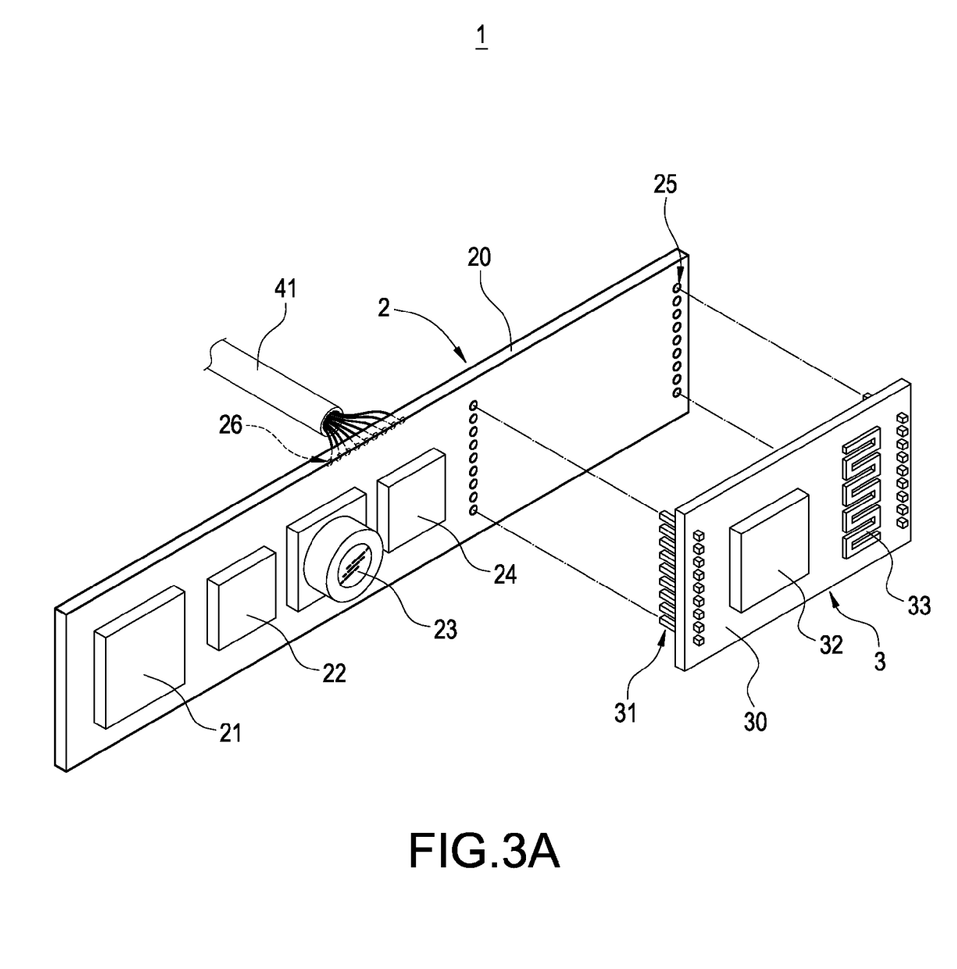
FIG. 3A shows an exploded view of the first embodiment of the present invention.
Figure 3B:
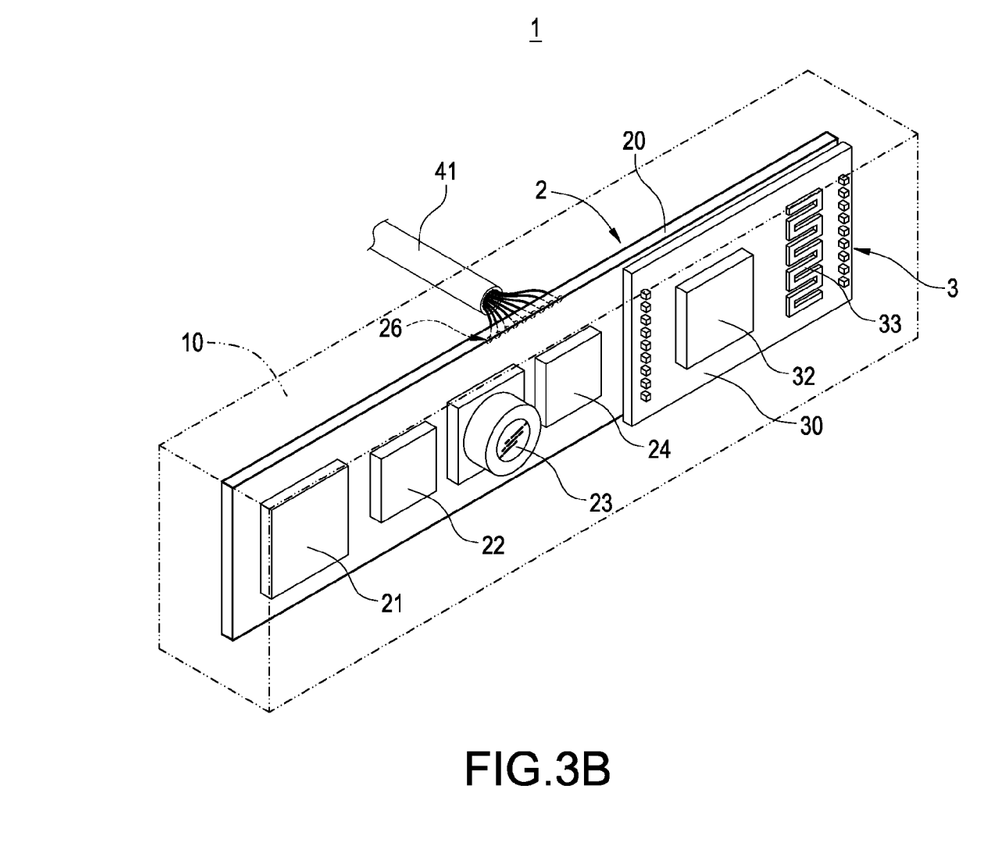
FIG. 3B shows an assembly drawing of the first embodiment of the present invention.

FIG. 3A shows an exploded view of the first embodiment of the present invention. FIG. 3B shows an assembly drawing of the first embodiment of the present invention. In this embodiment, the expansion interface 25 is a plurality of connection holes on the first circuit board 20. The connection interface 31 of the wireless module 3 comprises a plurality of connection pins as well, wherein one side of the connection pin is electrically connected to the second circuit board 30, and the other side of the connection pin plugs into the connection hole on the first circuit board 20.

As mentioned above, the wireless module 3 plugs into the connection holes on the first circuit board 20 through the connection interface 31 and combines with the video module 2 to form the wireless transmission and video integrated apparatus 1. The wireless transmission and video integrated apparatus 1 further comprises a blocking element 10 covering the video module 2 and the wireless module 3 to provide protecting from electromagnetic interference (EMI).

Figure 4A:
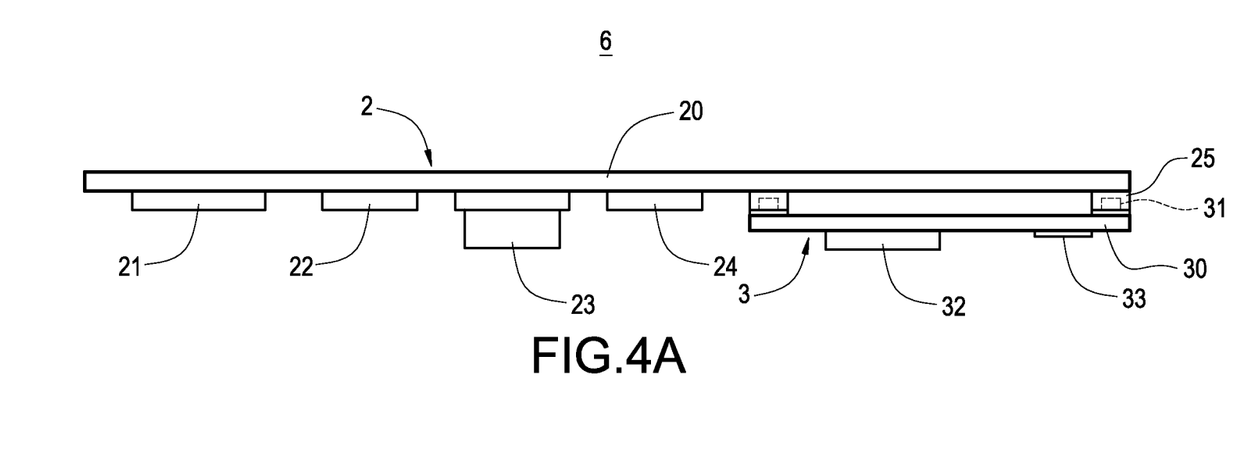
FIG. 4A shows an assembly drawing of the second embodiment of the present invention.
Figure 4B:
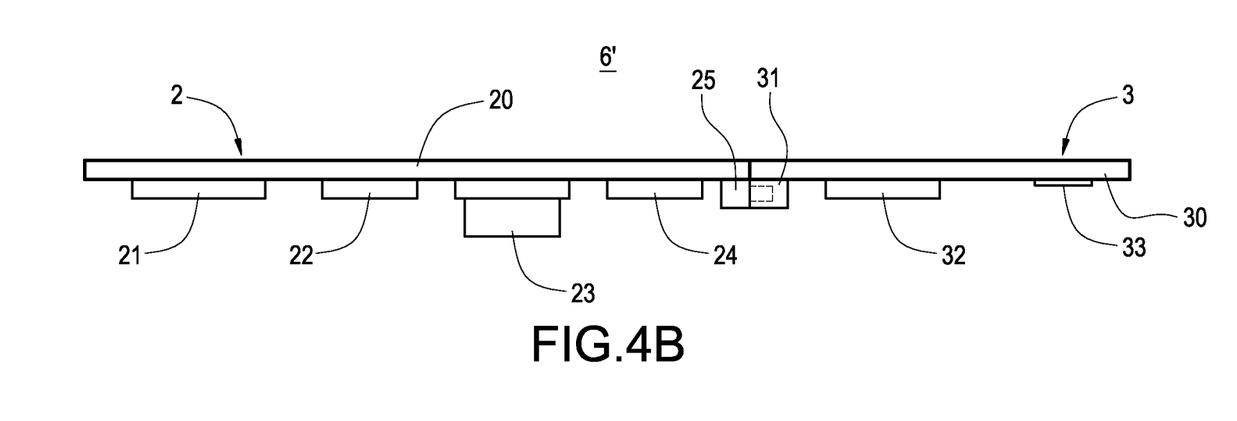
FIG. 4B shows an assembly drawing of the third embodiment of the present invention.

FIG. 4A shows an assembly drawing of the second embodiment of the present invention. FIG. 4B shows an assembly drawing of the third embodiment of the present invention.

The embodiment shown in FIG. 4A discloses a second type of the wireless transmission and video integrated apparatus 6. The expansion interface 25 of the wireless transmission and video integrated apparatus 6 is a butting connector arranged on the first circuit board 20. A connection port of the expansion interface 25 is arranged vertically on an upper side (namely, the component side having the hub unit 21, the image processing unit 22, the image acquisition unit 23 and the microphone unit 24) of the first circuit board 20.

The connection interface 31 of the wireless transmission and video integrated apparatus 6 are butting connectors arranged vertically on the second circuit board 30 and matches the type, quantity and locations of the expansion interface 25. A connection port of the connection interface 31 is arranged vertically on the lower side (namely, not the component side having the wireless communication unit 32 and the antenna unit 33) of the second circuit board 30. Therefore, the wireless module 3 vertically (namely, longitudinally) plugs into the expansion interface 25 of the video module 2 through the connection interface 31 to complete the connection.

In this embodiment, the expansion interface 25 and the connection interface 31 are butting connectors. In other embodiments, the expansion interface 25 and the connection interface 31 are row needles or row needle sockets, wherein the row needle sockets matches with and are plugged by the row needles.

FIG. 4B discloses a third type of the wireless transmission and video integrated apparatus 6' which is similar to the wireless transmission and video integrated apparatus 6 shown in FIG. 4A. The expansion interface 25 and the connection interface 31 of the wireless transmission and video integrated apparatus 6' are butting connectors as well, but the connection port of the expansion interface 25 of the wireless transmission and video integrated apparatus 6' is arranged horizontally on the first circuit board 20.

In this embodiment, the connection interface 31 of the wireless module 3 is arranged horizontally on the second circuit board 30. Therefore, the video module 2 horizontally plugs into the wireless module 3, so that the video module 2 and the wireless module 3 are connected in cascade.

Figure 5:
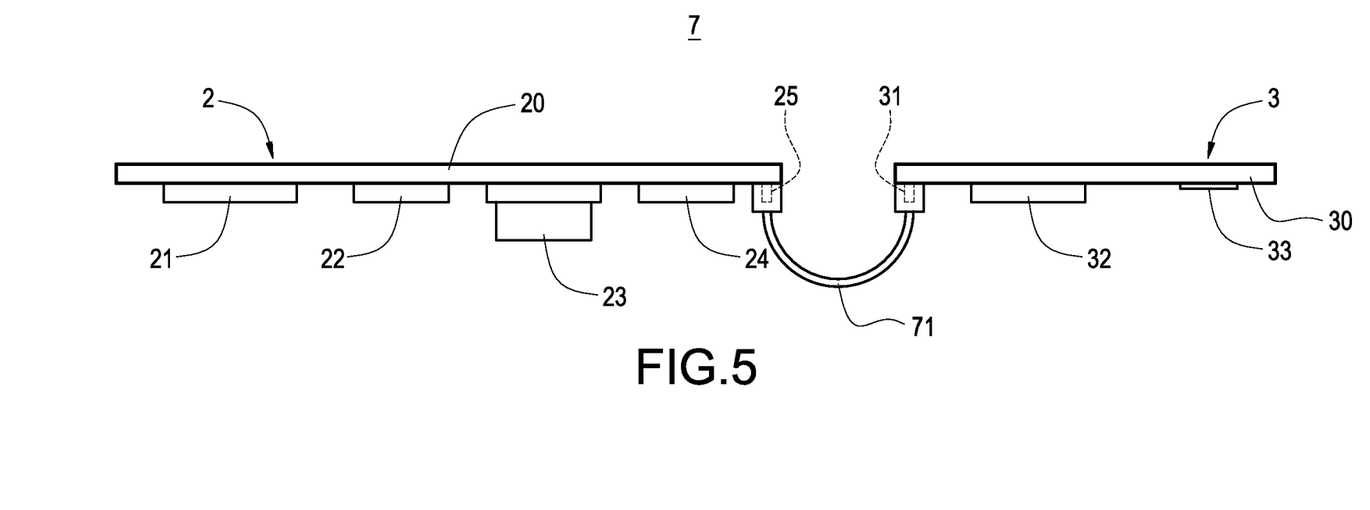
FIG. 5 shows an assembly drawing of the fourth embodiment of the present invention.

FIG. 5 shows an assembly drawing of the fourth embodiment of the present invention. FIG. 5 discloses a fourth type of the wireless transmission and video integrated apparatus 7. The expansion interface 25 of the wireless transmission and video integrated apparatus 7 is arranged on the first circuit board 20 and is row needles or row needle sockets.

The connection interface 31 of the wireless transmission and video integrated apparatus 7 is arranged on the second circuit board 30 and is row needles or row needle sockets. The quantity and the location belonging to the connection interface 31 match the quantity and the location belonging to the expansion interface 25. The wireless transmission and video integrated apparatus 7 further comprises at least a cable 71. Row needle sockets or row needles at one side of the cable 71 are plugged by or plug into the connection interface 31. Row needle sockets or row needles at the other side of the cable 71 are plugged by or plug into the expansion interface 25. Therefore, the wireless module 3 is connected to the video module 2 through the cable 71.

Figure 6:
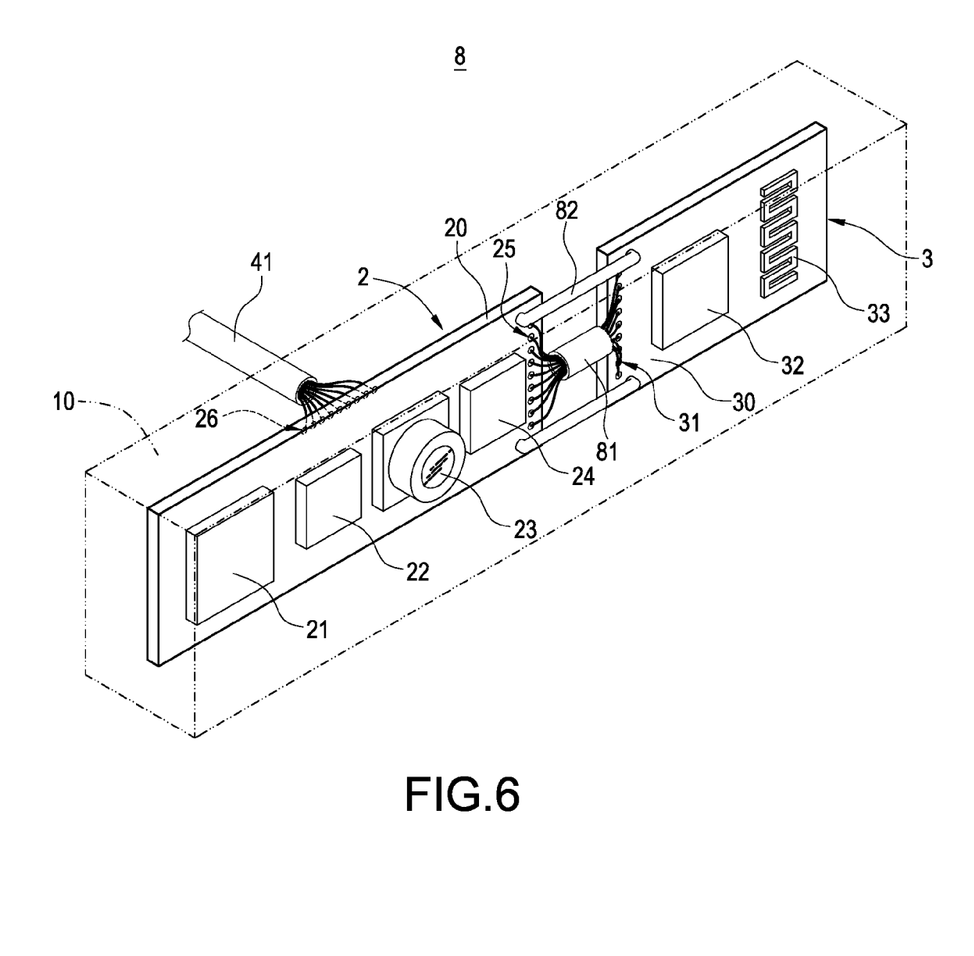
FIG. 6 shows an assembly drawing of the fifth embodiment of the present invention.

FIG. 6 shows an assembly drawing of the fifth embodiment of the present invention. FIG. 6 discloses a fifth type of the wireless transmission and video integrated apparatus 8. The expansion interface 25 of the wireless transmission and video integrated apparatus 8 is a plurality of connection points on the first circuit board 20.

The connection interface 31 of the wireless transmission and video integrated apparatus 8 is a plurality of connection points on the second circuit board 30. The quantity of the connection points belonging to the connection interface 31 matches the quantity of the connection points belonging to the expansion interface 25. The wireless transmission and video integrated apparatus 8 further comprises at least a connection wire 81. One side of the connection wire 81 is electrically connected to (for example, by welding) the connection interface 31. The other side of the connection wire 81 is electrically connected to (for example, by welding) the expansion interface 25. Therefore, the wireless module 3 is connected to the video module 2 through the connection wire 81.

Moreover, the wireless transmission and video integrated apparatus 8 further comprises at lease a fixing part 82. One side of the fixing part 82 is fixed at one side of the first circuit board 20. The other side of the fixing part 82 is fixed at one side of the second circuit board 30. Therefore, the video module 2 and the wireless module 3 are fixed together and are not waggled. Assembling the wireless transmission and video integrated apparatus 8 is fast. Moreover, the fixing part 82 can be arranged in the wireless transmission and video integrated apparatus 6, the wireless transmission and video integrated apparatus 6' or the wireless transmission and video integrated apparatus 7 mentioned above as well. The blocking element 10 which provides protecting from electromagnetic interference (EMI) and is disclosed in FIG. 3B can be arranged in the wireless transmission and video integrated apparatus 6, the wireless transmission and video integrated apparatus 6', the wireless transmission and video integrated apparatus 7 or the wireless transmission and video integrated apparatus 8 mentioned above as well.

Figure 7:
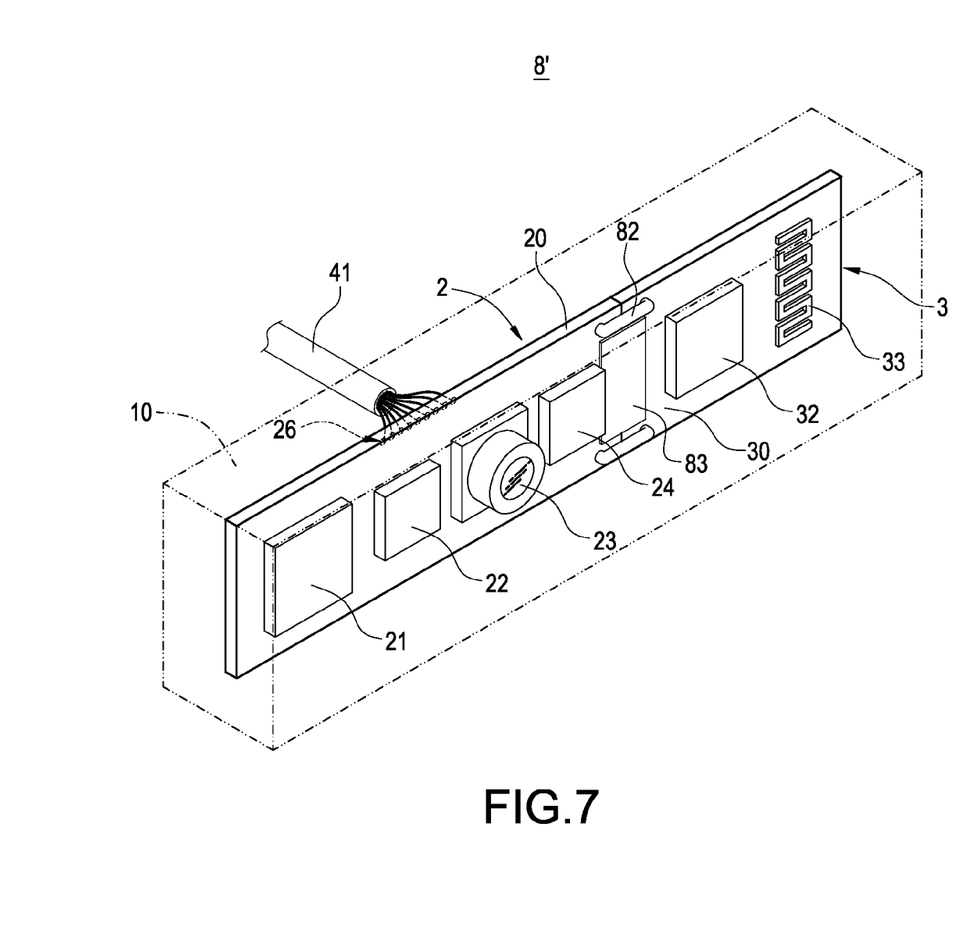
FIG. 7 shows an assembly drawing of the sixth embodiment of the present invention.

FIG. 7 shows an assembly drawing of the sixth embodiment of the present invention. FIG. 7 discloses a sixth type of the wireless transmission and video integrated apparatus 8' which is similar to the wireless transmission and video integrated apparatus 8 shown in FIG. 6. The expansion interface 25 and the connection interface 31 of the wireless transmission and video integrated apparatus 8' are connection points on the circuit boards as well. Moreover, the wireless transmission and video integrated apparatus 8' further comprises a thin film circuit board 83.

Connection circuits are pre-printed on the thin film circuit board 83. The thin film circuit board 83 is pasted on the expansion interface 25 of the video module 2 and on the connection interface 31 of the wireless module 3. Therefore, the connection interface 31 is electrically connected to the expansion interface 25 through the connection circuits pre-printed on the thin film circuit board 83. Furthermore, the video module 2 is connected to the wireless module 3.

The fixing part 82 mentioned above can be arranged on the video module 2 and the wireless module 3 of the wireless transmission and video integrated apparatus 8' as well. Therefore, the video module 2 and the wireless module 3 are fixed together, so that assembling the wireless transmission and video integrated apparatus 8' is fast. Moreover, the blocking element 10 which is mentioned above and provides protecting from electromagnetic interference (EMI) can be arranged in the wireless transmission and video integrated apparatus 8' as well.

Figure 8:
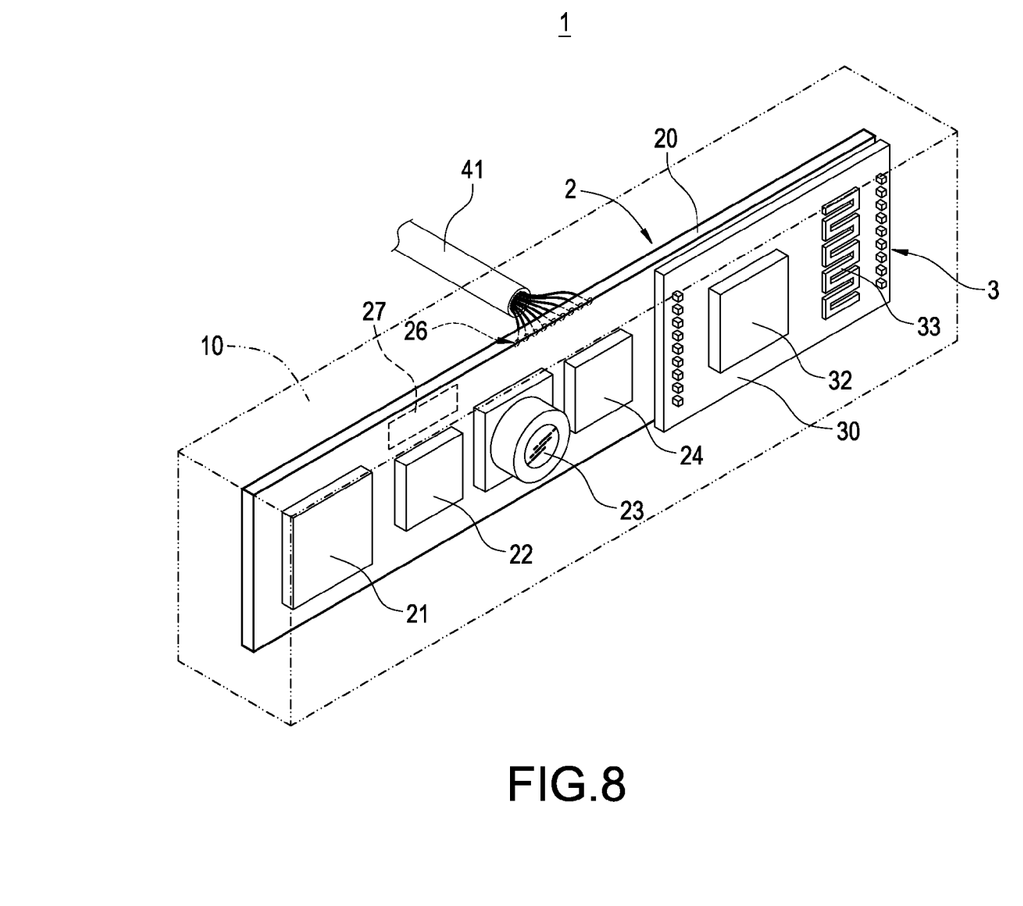
FIG. 8 shows an assembly drawing of the seventh embodiment of the present invention.

FIG. 8 shows an assembly drawing of the seventh embodiment of the present invention. In an embodiment of the present invention, the transmission interface 26 of the video module 2 is a plurality of connection points in compliance with USB specifications or is a USB connector. The transmission line 41 is in compliance with USB specifications. Therefore, before the video module 2 outputs the signals through the transmission interface 26, wherein the signals are received by the image processing unit 22, the microphone unit 24 and the wireless module 3, the format of the signals need to be converted into USB format.

As shown in FIG. 8, the wireless transmission and video integrated apparatus 1 further comprises a converting circuit 27 arranged on the first circuit board 20. The converting circuit 27 is electrically connected to the hub unit 21, the image processing unit 22, the microphone unit 24 and the expansion interface 25 through the first circuit board 20. The converting circuit 27 converts the signals outputted from the image processing unit 22, the microphone unit 24 and the wireless module 3. For example, if the wireless module 3 of the wireless transmission and video integrated apparatus 1 is a Wi-Fi communication module, the format of the signal outputted from the wireless module 3 can be peripheral component interconnect express (PCI-E) format. Therefore, after the hub unit 21 receives the wireless signal outputted from the wireless module 3, the converting circuit 27 converts the format of the wireless signal into USB format to obtain a USB format signal, and then the USB format signal is sent out through the transmission interface 26.

For another example, if the wireless module 3 of the wireless transmission and video integrated apparatus 1 is a NFC communication module, the format of the signal outputted from the wireless module 3 can be secure digital input/output (SDIO) format. Therefore, after the hub unit 21 receives the wireless signal outputted from the wireless module 3, the converting circuit 27 converts the format of the wireless signal into USB format to obtain a USB format signal, and then the USB format signal is sent out through the transmission interface 26.

Going with the converting circuit 27, the video module 2 can be expanded (connected) to any wireless modules or other function modules through the expansion interface 25. Therefore, for the manufacturer, the electronic apparatus can be quickly assembled, and the design is flexible for customers.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A wireless transmission and video integrated apparatus assembled to an electronic apparatus and electrically connected to a main board of the electronic apparatus, the wireless transmission and video integrated apparatus comprising:
a video module having a first circuit board, an image acquisition unit, an image processing unit, a microphone unit, a hub unit, an expansion interface and a transmission interface, the image acquisition unit electrically connected to the first circuit board and acquiring an image signal, the image processing unit electrically connected to the first circuit board and the image acquisition unit, the image processing unit processing the image signal with an analog-to-digital conversion, the microphone unit electrically connected to the first circuit board and acquiring an audio signal, the hub unit electrically connected to the first circuit board, the image processing unit and the microphone unit, the expansion interface electrically connected to the first circuit board and the hub unit, the transmission interface electrically connected to the first circuit board and the hub unit, the transmission interface connected to the main board; and
a wireless module having a second circuit board, an antenna unit, a wireless communication unit and a connection interface, the antenna unit electrically connected to the second circuit board and transmitting a wireless signal, the wireless communication unit electrically connected to the second circuit board and the antenna unit, the wireless communication unit processing the wireless signal, the connection interface electrically connected to the second circuit board, the wireless communication unit and the expansion interface, the connection interface outputting the wireless signal to the video module,
wherein the hub unit receives the image signal, the audio signal and the wireless signal, and outputs the image signal, the audio signal and the wireless signal to the main board through the transmission interface.

2. The wireless transmission and video integrated apparatus in claim 1, wherein the transmission interface is a plurality of connection points in compliance with universal serial bus specifications or is a universal serial bus connector; the transmission interface is electrically connected to a transmission line in compliance with the universal serial bus specifications; the transmission interface is electrically connected to the main board through the transmission line.

3. The wireless transmission and video integrated apparatus in claim 2, wherein the expansion interface is a plurality of connection holes on the first circuit board; the connection interface comprises a plurality of connection pins plugging into the expansion interface.

4. The wireless transmission and video integrated apparatus in claim 2, wherein the expansion interface is a butting connector arranged on the first circuit board; a connection port of the expansion interface is arranged vertically on an upper side of the first circuit board; the connection interface is a butting connector arranged vertically on the second circuit board, and a connection port of the connection interface is arranged vertically on a lower side of the second circuit board to be vertically connected to the expansion interface.

5. The wireless transmission and video integrated apparatus in claim 2, wherein the expansion interface is a butting connector arranged on the first circuit board; a connection port of the expansion interface is arranged horizontally on the first circuit board; the connection interface is a butting connector arranged on the second circuit board, and a connection port of the connection interface is arranged horizontally on the second circuit board to be horizontally connected to the expansion interface.

6. The wireless transmission and video integrated apparatus in claim 2, wherein the expansion interface is a plurality of connection points on the first circuit board; the connection interface is a plurality of connection points on the second circuit board; the wireless transmission and video integrated apparatus further comprises a connection wire; one side of the connection wire is electrically connected to the connection interface; the other side of the connection wire is electrically connected to the expansion interface.

7. The wireless transmission and video integrated apparatus in claim 2, wherein the expansion interface is a plurality of connection points on the first circuit board; the connection interface is a plurality of connection points on the second circuit board; the wireless transmission and video integrated apparatus further comprises a thin film circuit board; connection circuits are pre-printed on the thin film circuit board; the thin film circuit board is pasted on the connection interface and the expansion interface.

8. The wireless transmission and video integrated apparatus in claim 2, wherein the expansion interface is arranged on the first circuit board and is row needles or row needle sockets; the connection interface is arranged on the second circuit board and is row needles or row needle sockets; the wireless transmission and video integrated apparatus further comprises a cable; row needle sockets or row needles at one side of the cable are plugged by or plugs into the connection interface; row needle sockets or row needles at the other side of the cable are plugged by or plugs into the expansion interface.

9. The wireless transmission and video integrated apparatus in claim 5, further comprising a fixing part, wherein one side of the fixing part is fixed at one side of the first circuit board; the other side of the fixing part is fixed at one side of the second circuit board.

10. The wireless transmission and video integrated apparatus in claim 6, further comprising a fixing part, wherein one side of the fixing part is fixed at one side of the first circuit board; the other side of the fixing part is fixed at one side of the second circuit board.

11. The wireless transmission and video integrated apparatus in claim 7, further comprising a fixing part, wherein one side of the fixing part is fixed at one side of the first circuit board; the other side of the fixing part is fixed at one side of the second circuit board.

12. The wireless transmission and video integrated apparatus in claim 8, further comprising a fixing part, wherein one side of the fixing part is fixed at one side of the first circuit board; the other side of the fixing part is fixed at one side of the second circuit board.

13. The wireless transmission and video integrated apparatus in claim 2, further comprising a converting circuit electrically connected to the first circuit board, wherein the converting circuit is electrically connected to the hub unit, the image processing unit, the microphone unit and the expansion interface through the first circuit board; the converting circuit converts signals outputted from the image processing unit, the microphone unit and the wireless module.

\* \* \* \* \*